United States Patent
Higashi et al.

(10) Patent No.: US 10,355,576 B2
(45) Date of Patent: Jul. 16, 2019

(54) SIGNAL GENERATING CIRCUIT, VOLTAGE CONVERSION DEVICE, AND SIGNAL GENERATING METHOD

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Makoto Higashi, Mie (JP); Seiji Takahashi, Mie (JP); Takenori Abe, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 31 days.

(21) Appl. No.: 15/552,961

(22) PCT Filed: Feb. 25, 2016

(86) PCT No.: PCT/JP2016/055543
§ 371 (c)(1),
(2) Date: Aug. 23, 2017

(87) PCT Pub. No.: WO2016/136852
PCT Pub. Date: Sep. 1, 2016

(65) Prior Publication Data
US 2018/0248465 A1 Aug. 30, 2018

(30) Foreign Application Priority Data
Feb. 27, 2015 (JP) .................................. 2015-038912

(51) Int. Cl.
*H02M 1/08* (2006.01)
*H02M 3/157* (2006.01)
(Continued)

(52) U.S. Cl.
CPC ............. *H02M 1/08* (2013.01); *H02M 3/157* (2013.01); *H02M 3/158* (2013.01); *H03K 7/08* (2013.01);
(Continued)

(58) Field of Classification Search
CPC ........ H02M 1/08; H02M 3/157; H02M 1/088; H02M 3/158; H02M 2001/0012; H02M 2001/0025
(Continued)

(56) References Cited

U.S. PATENT DOCUMENTS

| 6,177,786 B1 | 1/2001 | Shimamori | |
|---|---|---|---|
| 6,407,480 B1 | 6/2002 | Nakanishi et al. | |
| 2006/0181256 A1* | 8/2006 | Nagai | H02M 3/157 323/283 |
| 2007/0258272 A1* | 11/2007 | Brown | H02M 3/157 363/26 |
| 2010/0207594 A1* | 8/2010 | Davoudi | H02M 3/157 323/283 |

(Continued)

FOREIGN PATENT DOCUMENTS

| JP | H03-098470 A | 4/1991 |
|---|---|---|
| JP | H11-289754 A | 10/1999 |

(Continued)

OTHER PUBLICATIONS

Search Report for PCT/JP2016/055543, dated May 24, 2016.

*Primary Examiner* — Nguyen Tran
*Assistant Examiner* — Demetries A Gibson
(74) *Attorney, Agent, or Firm* — Honigman LLP

(57) ABSTRACT

A CPU determines an ON-time setting value with which the generating unit generates a PWM signal having an ON time (Continued)

that is closest to the ON time corresponding to a product of a reference period and a target duty cycle, and sets the determined setting value in the generating unit. The CPU divides the ON time of the PWM signal based on the determined ON-time setting value, multiplies, by N, the period that corresponds to a result of the division, and specifies a period settable value with which a PWM signal having a period that is closest to a result of the multiplication is generated. The CPU determines period setting values for N periods based on a quotient and a remainder obtained by dividing the specified settable value by N, and sets the determined setting values in the generating unit for each period of the PWM signal.

10 Claims, 11 Drawing Sheets

(51) Int. Cl.
    *H03K 7/08*       (2006.01)
    *H02M 3/158*     (2006.01)
    *H02M 1/00*      (2006.01)

(52) U.S. Cl.
    CPC ............. *H02M 2001/0012* (2013.01); *H02M 2001/0025* (2013.01)

(58) Field of Classification Search
    USPC ........................................... 323/283
    See application file for complete search history.

(56) References Cited

U.S. PATENT DOCUMENTS

| | | | | |
|---|---|---|---|---|
| 2010/0270989 A1* | 10/2010 | Sasaki | .................. | H02M 3/157 323/282 |
| 2014/0002036 A1* | 1/2014 | Shimizu | ................. | H02M 3/04 323/234 |
| 2014/0139198 A1* | 5/2014 | Manlove | .............. | H02M 3/156 323/282 |
| 2015/0084607 A1* | 3/2015 | Hayami | ................ | H02M 3/158 323/271 |
| 2015/0349639 A1* | 12/2015 | Hosoyama | ........... | H02M 3/158 323/271 |
| 2016/0141956 A1* | 5/2016 | Dong | .................... | H02M 3/157 323/271 |
| 2017/0237347 A1* | 8/2017 | Houston | .............. | H02M 3/157 323/271 |
| 2018/0013345 A1* | 1/2018 | Kakuno | ................ | H02M 3/157 |
| 2018/0019654 A1* | 1/2018 | Higashi | ................ | H02M 1/08 |
| 2018/0054122 A1* | 2/2018 | Takeya | .................... | H02M 1/08 |

FOREIGN PATENT DOCUMENTS

| JP | 2000-133485 A | 5/2000 |
|---|---|---|
| JP | 2002-325437 A | 11/2002 |

* cited by examiner

FIG. 8

| Target duty cycle (%) | Period and ON-time setting values for N periods ||||| Average (%) of the duty cycles over the N periods |
|---|---|---|---|---|---|---|
| | Period setting value |||| ON-time setting value | |
| | First period | Second period | Third period | Fourth period | | |
| ⋮ | ⋮ | ⋮ | ⋮ | ⋮ | ⋮ | ⋮ |
| 34.79~34.99 | 9 | 8 | 9 | 8 | 3 | 35.29 |
| 35.00~35.16 | 12 | 11 | 12 | 11 | 4 | 34.78 |
| ⋮ | ⋮ | ⋮ | ⋮ | ⋮ | ⋮ | ⋮ |
| 43.84~44.49 | 9 | 9 | 9 | 9 | 4 | 44.44 |
| 45.00~45.97 | 11 | 11 | 11 | 11 | 5 | 45.45 |
| 45.98~47.05 | 11 | 11 | 11 | 10 | 5 | 46.51 |
| 47.06~48.19 | 11 | 10 | 11 | 10 | 5 | 47.62 |
| 48.20~49.38 | 11 | 10 | 10 | 10 | 5 | 48.78 |
| 49.39~50.63 | 10 | 10 | 10 | 10 | 5 | 50.00 |
| 50.64~51.94 | 10 | 10 | 10 | 9 | 5 | 51.28 |
| 51.95~53.33 | 10 | 9 | 10 | 9 | 5 | 52.63 |
| 53.34~54.79 | 10 | 9 | 9 | 9 | 5 | 54.05 |
| 54.80~54.99 | 9 | 9 | 9 | 9 | 5 | 55.56 |
| 55.00~55.17 | 11 | 11 | 11 | 11 | 6 | 54.55 |
| ⋮ | ⋮ | ⋮ | ⋮ | ⋮ | ⋮ | ⋮ |

SIGNAL GENERATING CIRCUIT, VOLTAGE CONVERSION DEVICE, AND SIGNAL GENERATING METHOD

CROSS-REFERENCE TO RELATED APPLICATIONS

This application is the U.S. national stage of PCT/JP2016/055543 filed Feb. 25, 2016, which claims priority of Japanese Patent Application No. JP 2015-038912 filed Feb. 27, 2016.

TECHNICAL FIELD

The present invention relates to a signal generating circuit, a voltage conversion device, and a signal generating method in which a generating unit that generates a signal having a period and an ON time that correspond to a setting value, and a control unit that sets settable values for periods and an ON time (period and ON-time settable values) that are settable in the generating unit in accordance with a target duty cycle are provided.

BACKGROUND

Conventionally, voltage conversion devices that drive a switching element with a PWM (Pulse Width Modulation) signal to convert a voltage are widely used. In such voltage conversion devices of a PWM control type, for example, a voltage command value is calculated based on a target voltage value, values that correspond to the calculated voltage command value are set in a PWM signal generating unit, and thereby PWM signals having duty cycles that correspond to the setting values is generated. By changing the duty cycles of the PWM signals that drive the switching element based on the target voltage value in this way, an output voltage that corresponds to the target voltage value can be obtained.

Here, if the values that are settable in the PWM signal generating unit (hereinafter, referred to as "settable values") have a relatively large minimum unit (that is, minimum increment), the duty cycles of the PWM signal cannot smoothly be changed in response to a change in the target value, and the output voltage will change stepwise. Furthermore, for example, if a target value that is to be set in the PWM signal generating unit is calculated as an operation amount in PWM control, and a minimum unit of the settable values is larger than a minimum unit of the target value, the duty cycles of the PWM signal cannot smoothly be changed in response to a change in the target voltage value and a load change, and an error will occur in the output voltage.

To solve this, JP-H03-98470A discloses a PWM inverter that calculates an on/off time of a PWM signal in each period of PWM control using the division such that a voltage command value is used as a dividend and a remainder is truncated, and outputs a PWM pulse based on the calculation result. The remainder obtained in the above-described calculation corresponds to a voltage command value that is truncated without being reflected in the on/off time.

In this PWM inverter, the truncated remainders are sequentially added to voltage command values in the calculation in the next period onwards, such that a remainder that was not reflected in an on/off time in the previous calculation is reflected in a new on/off time in the next calculation, and a remainder that is obtained in this calculation is reflected in the calculation after the next calculation, and such processes are repeated. Accordingly, it is possible to bring an average on/off time that is to be set in the PWM signal generating unit close to a target on/off time that is set ideally. In other words, it is possible to make a minimum unit of values that are to be set in generating unit on average smaller than an actual minimum unit.

However, in the technique disclosed in JP-H03-98470A, calculation including division is executed in each period of PWM control to determine an on/off time of a PWM signal, and thus a high processing load occurs in each period. Accordingly, there is a risk that an inexpensive microcomputer having low throughput cannot complete the above-described calculation processing within one period of PWM control.

The present invention was made in view of such circumstances, and it is an object of thereof to provide a signal generating circuit, a voltage conversion device, and a signal generating method in which it is possible to make a minimum unit of values that are to be set in a generating unit that generates a signal having a period and an ON time that correspond to the setting values substantially smaller than an actual minimum unit.

SUMMARY

According to one aspect of the present invention, a signal generating circuit includes: a generating unit configured to generate a PWM signal that has a period and an ON time that correspond to a setting value; and a control unit configured to set period and ON-time settable values that are settable in the generating unit in accordance with a target duty cycle, the generating unit applying the PWM signal to an external voltage conversion circuit, and the voltage conversion circuit being subjected to PWM control to convert a voltage, wherein the control unit includes: a first determination unit configured to determine, at every N periods (where N is a natural number equal to or greater than 2) of the signal, an ON-time settable value with which a signal having an ON time that approximates a product of a predetermined period and the target duty cycle is generated, the ON-time settable value being set in the generating unit; a first calculation unit configured to divide the ON time of the signal generated based on the ON-time settable value determined by the first determination unit by the target duty cycle, and multiply, by N, a period that corresponds to a result of the division, to calculate a sum of the periods for N periods; a specifying unit configured to specify a period settable value with which a signal having a period that approximates the sum calculated by the first calculation unit is generated; a second calculation unit configured to divide the period settable value specified by the specifying unit by N to obtain a quotient and a remainder; and a second determination unit configured to determine N period settable values for the N periods that are set in the generating unit, based on the quotient and the remainder that were obtained by the second calculation unit.

According to one aspect of the present invention, the signal generating circuit may be such that the second determination unit is configured to determine N period settable values for the N periods, by specifying the quotient as a reference value for the period settable values, splitting the remainder into minimum units of the period settable values, and adding the minimum units to at least one of the reference values for N periods.

According to one aspect of the present invention, the signal generating circuit may further include a storage unit in which a storage unit in which period and ON-time settable values for N periods are stored in association with a predetermined duty cycle, wherein the first and second determination units are configured to determine the period and ON-time settable values for N periods that correspond to the predetermined duty cycle from information stored in the storage unit.

According to one aspect of the present invention, the signal generating circuit may be such that the control unit is configured to read, from the storage unit, the period and ON-time settable values for N periods that were determined by the second determination unit, and set the read settable values in the generating unit.

According to one aspect of the present invention, a voltage conversion device includes the signal generating circuit according to any one of claims 1 to 4; a voltage conversion circuit configured to convert a voltage using switching based on a duty cycle of a signal generated by the signal generating circuit; and a detection unit configured to detect the voltage converted by the voltage conversion circuit, wherein the control unit provided in the signal generating circuit includes a third calculation unit configured to calculate the target duty cycle based on the voltage detected by the detection unit.

According to one aspect of the present invention, a signal generating method in which a signal generating circuit generates a PWM signal, the signal generating circuit including a generating unit configured to generate the signal having a period and ON time that correspond to a setting value, and a control unit configured to set period and ON-time settable values that are settable in the generating unit in accordance with a target duty cycle, the generating unit applying the PWM signal to an external voltage conversion circuit, the voltage conversion circuit being subjected to PWM control to convert a voltage, and the method comprising: determining, at every N periods (where N is a natural number equal to or greater than 2) of the signal, an ON-time settable value with which a signal having an ON time that approximates a product of a predetermined period and the target duty cycle is generated, the ON-time settable value being set in the generating unit; dividing the ON time of the signal generated based on the ON-time settable value determined by the first determination unit by the target duty cycle, and multiplying, by N, a period that corresponds to a result of the division, to calculate a sum of the periods for N periods; specifying a period settable value with which a signal having a period that approximates the calculated sum is generated; dividing the specified period settable value by N to obtain a quotient and a remainder; and determining N period settable values for the N periods that are set in the generating unit, based on the calculated quotient and remainder.

According to one aspect, the control unit determines period and ON-time settable values that are settable in the generating unit in accordance with a target duty cycle, and sets them in the generating unit. In this context, "settable value" refers to a value that is equal to an integral multiple of a minimum unit of a value that can be set in the generating unit. Specifically, the control unit determines, at every N periods of a signal that is generated by the generating unit, an ON-time settable value with which a signal having an ON time that approximates the ON time corresponding to a product of a predetermined period and the target duty cycle is obtained, and sets the determined ON-time settable value in the generating unit. In parallel to this, the control unit: divides the ON time of the signal generated by the generating unit based on the determined ON-time settable value by the target duty cycle; multiplies, by N, a period that corresponds to a result of this division; specifies a period settable value with which a signal having a period that is closer to a result of this multiplication of the quotient by N is generated; divides the specified settable value by N to obtain a quotient and a remainder; determines period settable values for N periods based on the obtained quotient and remainder; and sets the determined settable values in the generating unit one by one at each period of the signal.

Accordingly, the period settable values for N periods are determined by the control unit such that an average of the duty cycles over the N periods of the signal generated by the generating unit approximates the target duty cycle, and are set in the generating unit, and thus an average value of the period settable values for N periods as a whole is adjusted more finely than a minimum unit (minimum increment) of the period settable values.

According to one aspect, the quotient obtained as a result of the above-described division is specified as a reference value for the period settable values for N periods as a whole, and the remainder obtained as a result of the above-described division is split into minimum units (that is, minimum increments) of the period settable values, and the value of the divided minimum units is added to at least one of the reference values for N periods, so as to determine the period settable values for N periods.

Accordingly, the value obtained by splitting the remainder into minimum units is appropriately allocated to at least one of the period settable values for N periods, so that at least one of the period settable values for N periods are determined as being equal to a value obtained by adding the minimum unit value of the period settable values to the reference value, and the remaining settable values except for the at least one settable value are determined as being equal to the reference value.

According to one aspect, predetermined period and ON-time settable values for N periods are stored in the storage unit in association with a target duty cycle. The control unit determines, the period and ON-time settable values for N periods that correspond to the target duty cycle, and that are to be set in the generating unit based on information stored in the storage unit.

Accordingly, it is possible to easily determine period and ON-time settable values for N periods that are to be determined based on the target duty cycle at the time of execution of control by the control unit.

According to one aspect, the control unit sequentially reads period and ON-time settable values for N periods from the storage unit, and sets them in the generating unit.

Accordingly, it is possible to set the content of the storage unit sequentially in the generating unit over N periods.

According to one aspect, the voltage conversion circuit converts a voltage, using switching based on a duty cycle of a signal generated by the above-described signal generating circuit, and the control unit of the signal generating circuit calculates the above-described target duty cycle based on the converted voltage.

Accordingly, the signal generating circuit that can make a minimum unit of values that are to be set in the generating unit that periodically generates signals substantially smaller than an actual minimum unit is applied to the voltage conversion device, improving the accuracy in an output voltage.

Advantageous Effects of Invention

As described above, period settable values for N periods are determined by the control unit such that an average of the duty cycles over the N periods of a signal generated by the generating unit approximates a target duty cycle, and are set in the generating unit, and thus an average value of the period settable values for N periods as a whole is adjusted more finely than a minimum unit (that is, minimum increment) of the period settable values.

Accordingly, it is possible to make a minimum unit of values that are to be set in the generating unit that generates a signal having a period and an ON time that correspond to a setting value substantially smaller than an actual minimum unit.

BRIEF DESCRIPTION OF DRAWINGS

FIG. 8 is a table illustrating a list of period and ON-time setting values for N periods that are determined based on target duty cycles.

DETAILED DESCRIPTION OF PREFERRED EMBODIMENTS

Hereinafter, the present invention will be described in detail with reference to the drawings illustrating embodiments thereof.

Embodiment 1

Figure 1:
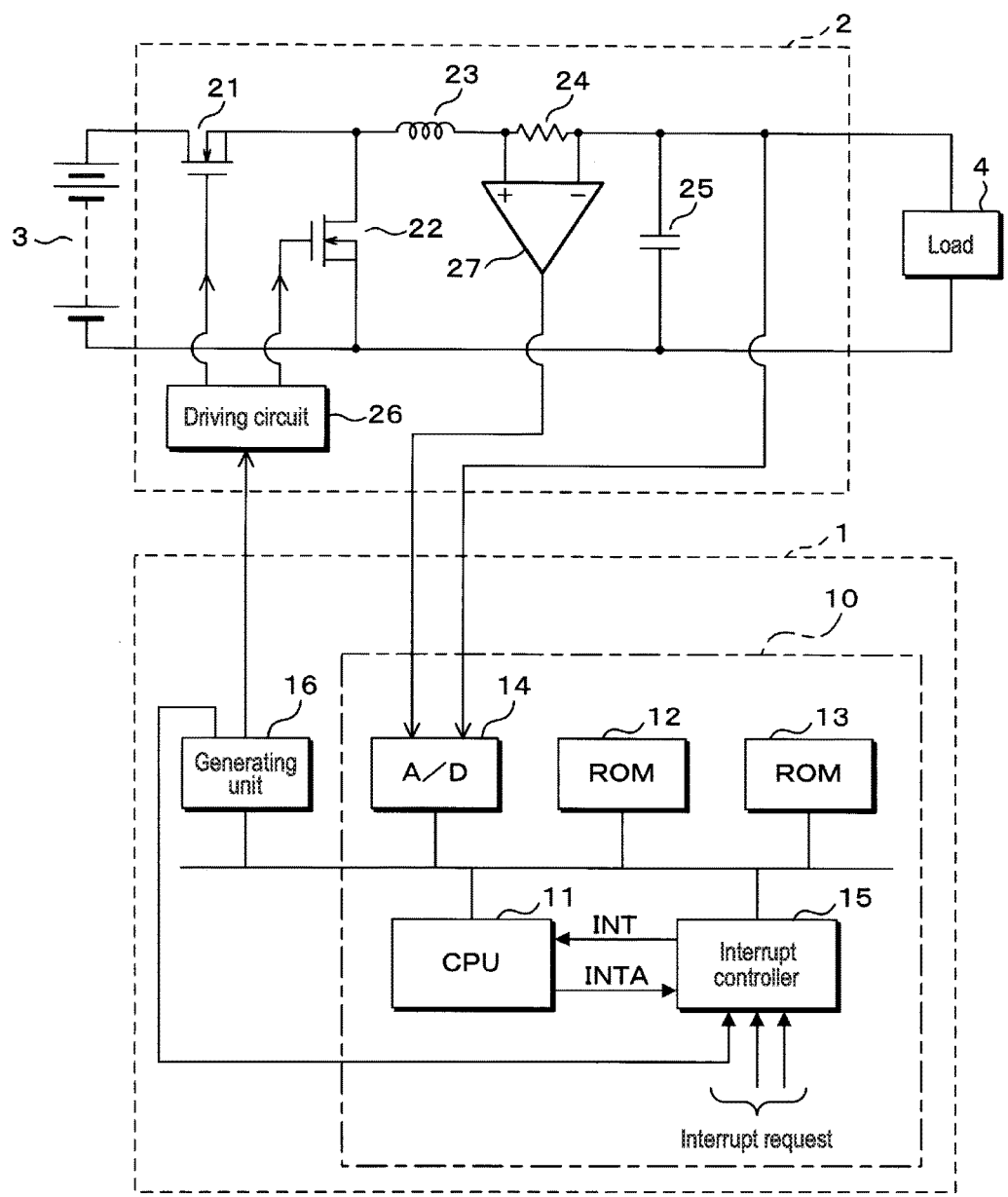
FIG. 1 is a block diagram illustrating an example of a configuration of a voltage conversion device according to Embodiment 1 of the present invention.
Figure 2:
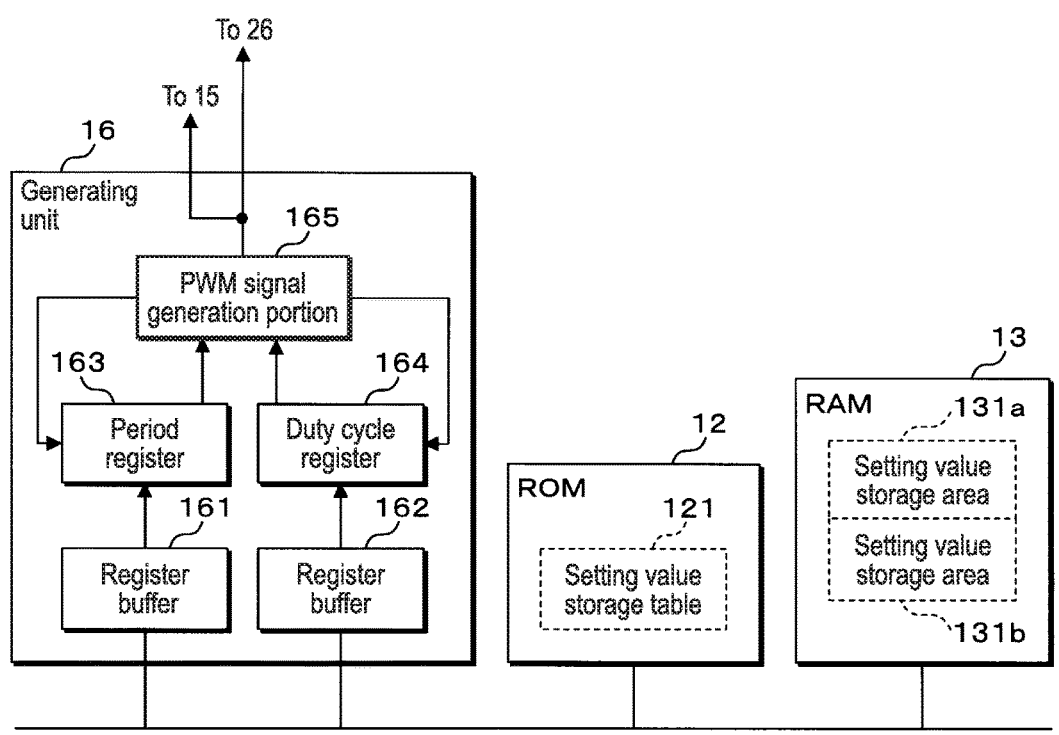
FIG. 2 is a block diagram illustrating an example of a configuration of a part of a signal generating circuit according to Embodiment 1 of the present invention.

FIG. 1 is a block diagram illustrating an example of a configuration of a voltage conversion device according to Embodiment 1 of the present invention, and FIG. 2 is a block diagram illustrating an example of a configuration of a part of a signal generating circuit according to Embodiment 1 of the present invention. In the drawing, the reference numeral 1 denotes the signal generating circuit. The signal generating circuit 1 generates a PWM signal whose period and ON time change, and applies the generated PWM signal to a voltage conversion circuit 2. The voltage conversion circuit 2 converts a voltage of an external battery 3, and supplies the converted voltage to an external load 4. Here, the voltage conversion circuit 2 reduces (steps down) the voltage of the battery 3, but the voltage conversion circuit 2 may also raise (step up), or may raise and reduce the voltage of the battery 3.

The signal generating circuit 1 is a microcomputer provided with a CPU (Central Processing Unit) 11. The CPU 11 is connected, via a bus, to a ROM (Read Only Memory) 12 in which information such as a program is stored, a RAM (Random Access Memory) 13 in which information is temporarily stored, an A/D converter (that corresponds to a "detection unit") 14 that converts an analog voltage into a digital value, an interrupt controller 15 that processes a plurality of interrupt requests, and a generating unit 16 that generates a PWM signal. The components of the signal generating circuit 1 except for the generating unit 16 constitute a control unit 10, but the generating unit 16 may be included in the control unit 10.

The interrupt controller 15 is configured to be able to accept a plurality of interrupt requests, and applies, upon accepting an interrupt request, a signal (so-called INT signal) to the CPU 11 to request it to perform an interrupt, and transmits, upon receiving an acknowledgement signal (so-called INTA signal) from the CPU 11, an interrupt vector that corresponds to the interrupt request to the bus. The configuration is such that, when the interrupt vector transmitted to the bus is read in the CPU 11, the CPU 11 executes interrupt processing that corresponds to the interrupt request.

The voltage conversion circuit 2 is provided with an N-channel MOSFET (Metal Oxide Semiconductor Field Effect Transistor: hereinafter, referred to simply as "FET") 21 having a drain that is connected to a positive terminal of the battery 3, a FET 22 having a drain and a source that are respectively connected to a source of the FET 21 and to a negative terminal of the battery 3, and a driving circuit 26 that applies driving signals to gates of the FET 21 and the FET 22 based on a PWM signal applied from the generating unit 16.

The load 4 is connected between the drain and the source of the FET 22 via a series circuit of an inductor 23 and a resistor 24. A capacitor 25 is connected in parallel to the load 4. A voltage of a connecting point between the resistor 24 and the capacitor 25 is applied to an A/D converter 14. An electric current detector 27 is connected to both ends of the resistor 24, and a detection voltage from the electric current detector 27 is applied to the A/D converter 14.

Moving to FIG. 2, the ROM 12 includes a setting value storage table (that corresponds to a "storage unit") 121 in which a plurality of predetermined setting values are stored in association with target duty cycles, which will be described later. Note that the setting value storage table 121 is not used in Embodiment 1.

The RAM 13 includes setting value storage areas 131$a$ and 131$b$ that are duplicated so as to enable storing and reading of a plurality of setting values at different timings. The setting values stored in the setting value storage area 131$a$ (or 131$b$) are sequentially set in the generating unit 16 by interrupt processing (described later) that is conducted by the interrupt controller 15.

The generating unit 16 is provided with register buffers 161 and 162 in which period and ON-time setting values, which will be described later, are set, a period register 163 and a duty cycle register 164 into which the content of the register buffers 161 and 162 are periodically loaded, and a PWM signal generation portion 165 that generates a PWM signal having a period and an ON time that correspond to the content of the period register 163 and the duty cycle register 164. The PWM signal generation portion 165 applies, to the period register 163 and the duty cycle register 164, load signals for loading the content of the register buffers 161 and 162.

The PWM signal generation portion 165 generates, based on a not-shown internal clock and the content of the period register 163 and the duty cycle register 164, a PWM signal having a period and an ON time that correspond to integral multiples of the internal clock period. The PWM signal generated by the PWM signal generation portion 165 is applied to the driving circuit 26 and is also applied as an interrupt request to the interrupt controller 15.

In the above-described configuration, the CPU 11 of the signal generating circuit 1 controls a voltage to be supplied to the load 4 by, for example, a current mode control method in which voltage loop control and current loop control are executed in parallel. In the voltage loop control, the CPU 11 calculates an operation amount, which serves as a target current value in the current loop control of the subsequent stage, based on a deviation obtained by subtracting a digital value into which an output voltage supplied to the load 4 is converted by the A/D converter 14 from a target voltage value. In this voltage loop control, a voltage that is output from the voltage conversion circuit 2 serves as a control amount.

In the current loop control, the CPU 11 calculates an operation amount with respect to the generating unit 16, based on a deviation obtained by subtracting a digital value into which a detection voltage from the electric current detector 27 is converted by the A/D converter 14 from the target current value obtained in the voltage loop control of the previous stage. The CPU 11 further determines period and ON-time settable values that are settable in the generating unit 16 based on the calculated operation amount (hereinafter, referred to as "target duty cycle"). In this context, "settable value" refers to a value that is equal to an integral multiple of a minimum unit (minimum increment) that is reflected in a change in an output PWM signal when it is set in the generating unit 16. Hereinafter, for simplicity, settable values that are determined to be set in the generating unit 16 are referred to as "setting values". As a result of the determined period and ON-time setting values being set, the generating unit 16 generates a PWM signal having a period and a duty cycle that correspond to the setting values. In this current loop control, a current that is output from the voltage conversion circuit 2 serves as a control amount.

Here, if an output voltage and an output current of the voltage conversion device change relatively smoothly over time, it can be sufficient that the above-described voltage loop control and current loop control are performed in a period that is N times (where N is a natural number equal to or greater than 2) the PWM period. Accordingly, in Embodiment 1, every N PWM periods, period and ON-time setting values for N periods are collectively determined for the generating unit 16, and are stored in the setting value storage area 131a or 131b. The period and ON-time setting values are set in the generating unit 16 by interrupt processing that occurs at the PWM period.

Hereinafter, for simplicity, it is assumed that N=4, but the present invention is not limited to this, and "N" may be 2, 3, or 5 or more. Furthermore, setting values for N periods are not necessarily set in the generating unit 16 in each period, and may also be set only when at least one of a setting value for the period (period setting value) and a setting value for the ON time (ON-time setting value) changes between a given period and the subsequent period.

The following will describe how the PWM signal generation portion 165 generates a PWM signal having a period and an ON time that respectively correspond to the content of the period register 163 and the duty cycle register 164.

Figure 3:
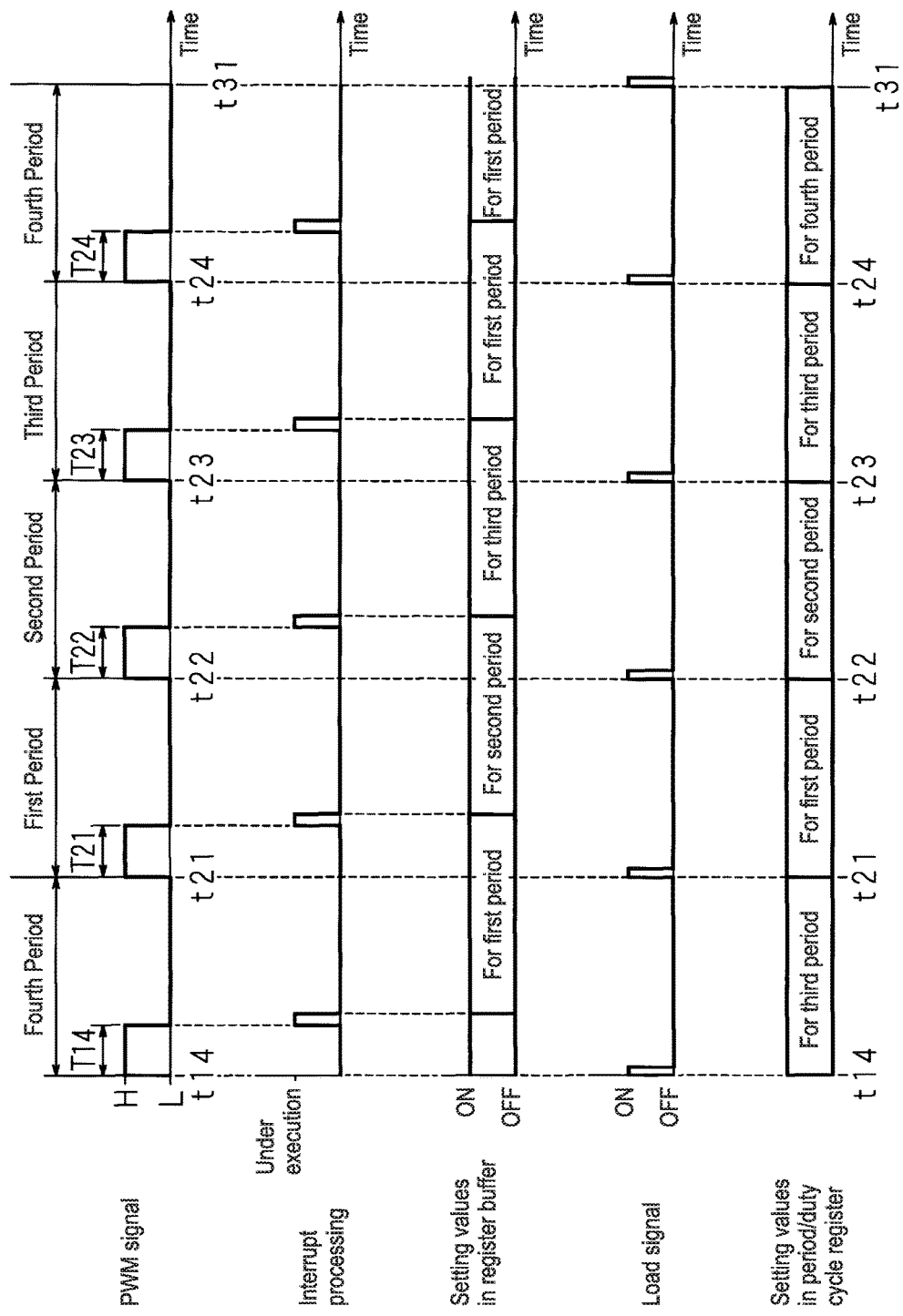
FIG. 3 is a timing diagram illustrating an operation of a generating unit.

FIG. 3 is a timing diagram illustrating an operation of the generating unit 16. All of five timing charts shown in FIG. 3 have the same time axis as the horizontal axis, and the vertical axis shows, from top to bottom, a signal level of a PWM signal, an execution state of interrupt processing that is executed based on the PWM signal, a content of the register buffer 161 or 162 of the generating unit 16, an on/off state of a load signal for loading the content of the register buffers 161 and 162 into the period register 163 and the duty cycle register 164, and a content of the period register 163 or the duty cycle register 164.

A PWM signal has a first period from a time t21 to a time t22, a second period from the time t22 to a time t23, and a third period from the time t23 to a time t24, and a fourth period from the time t24 to a time t31, that is, N periods (with N=4). The time t14 to the time t21 is the fourth period of the previous N periods. A timing at which the PWM signal rises is coincident with a point in time when each period starts. A falling edge of the PWM signal at which its signal level changes from H to L in each period is received as an interrupt request by the interrupt controller 15, and interrupt processing is executed once.

Specifically, interrupt processing is executed when the ON time periods T14, T21, T22, T23, and T24 in the respective periods have elapsed from the times t14, t21, t22, t23, and t24. In the interrupt processing, period and ON-time setting values for use in the subsequent PWM period are read from the setting value storage area 131a or 131b included in the RAM 13, and are set in the register buffers 161 and 162. Note that, if one ON-time setting value is determined for N periods as will be described later, this ON-time setting value is set in the register buffer 162 once in N periods.

Storing the period and ON-time setting values in the setting value storage area 131a (or 131b) is performed during the N periods in which reading from the setting value storage area 131b (or 131a) is performed, and that are prior to the period in which reading from the setting value storage area 131a (or 131b) starts. For example, setting values that are read from the setting value storage area 131a (or 131b) in the fourth period, the first period, the second period, and the third period that are successive from the time t14 are calculated and stored in the setting value storage area 131a (or 131b) during the fourth period, the first period, the second period, and the third period prior to the time t14. In this case, reading of setting values during the fourth period, the first period, the second period, and the third period prior to the time t14 is performed from the setting value storage area 131b (or 131a).

The setting values for the first period, the second period, the third period, and the fourth period that are stored in the setting value storage area 131a (or 131b) are sequentially read by interrupt processes in the fourth period, the first period, the second period, and the third period after the setting values have been stored, and are set in the register buffers 161 and 162. Accordingly, in the interrupt processes that are performed in the fourth period, the first period, the second period, and the third period, the content of the register buffers 161 and 162 are overwritten with the setting values for the first period, the second period, the third period, and the fourth period.

On the other hand, at rising edges of the PWM signal at which its signal level changes from L to H, that is, at the times t14, t21, t22, t23, t24, and t31, the PWM signal generation portion 165 applies, to the period register 163 and the duty cycle register 164, load signals for loading the content of the register buffers 161 and 162. Accordingly, during the first period, the second period, the third period, and the fourth period, the content of the period register 163 and the duty cycle register 164 are maintained as the setting values for the first period, the second period, the third period, and the fourth period. Based on these setting values, periods and ON time of the PWM signal in the first period, the second period, the third period, and the fourth period are determined.

The following will describe a specific example in which period and ON-time setting values that correspond to a target duty cycle are set in the generating unit 16.

Figure 4:
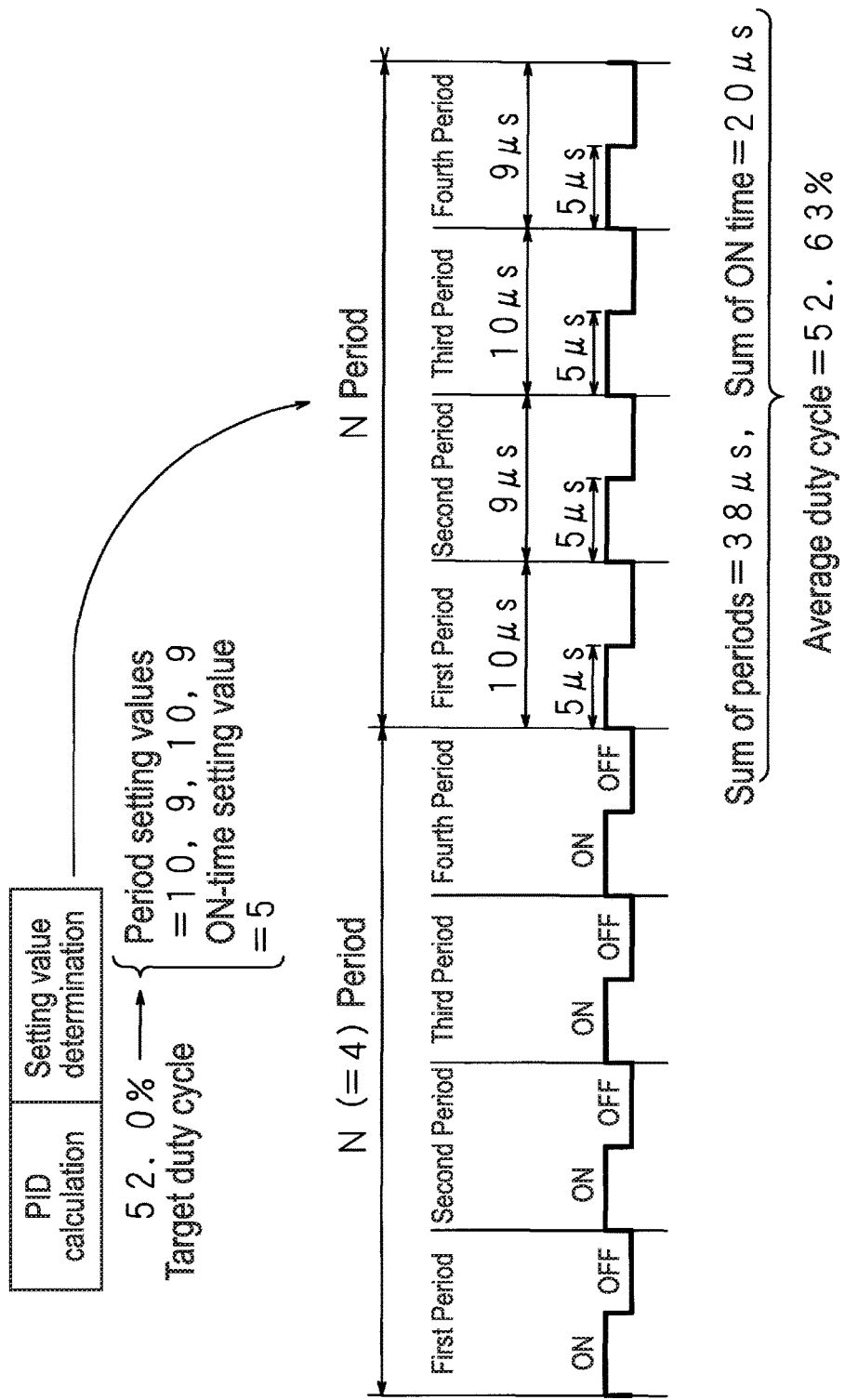
FIG. 4 is a diagram illustrating an operation in which typical duty cycles of a PWM signal are determined based on setting values for N periods.

FIG. 4 is a diagram illustrating an operation in which typical duty cycles of a PWM signal are determined based on setting values for N periods. In the drawing, the horizontal axis denotes time, and the vertical axis shows the signal levels of the PWM signal. FIG. 4 shows a condition in which the PWM signal changes between on and off in the first PWM periods, the second PWM periods, the third PWM period, and the fourth PWM periods of two series of N periods. The signal is ON in the first half of each PWM period, and is OFF in the last half. Also here, for simplicity, it is assumed that N=4.

In Embodiment 1, a standard period (hereinafter, referred to as "reference period") of a PWM signal that is generated by the generating unit 16 is 10 µs, and a minimum unit (that is, a minimum increment) of period and ON-time setting values that are settable in the generating unit 16 is 1, the minimum unit "1" corresponding to his of both of the period and ON time of the PWM signal. In other words, periods and an ON time of a PWM signal that is generated by the generating unit 16 can be set in units of 1 µs. On the other hand, it is assumed that the minimum unit of a target duty cycle that is calculated by the CPU 11 using PID calculation is 0.1%.

In the timing shown in FIG. 4, a case is considered in which, as a result of the PID calculation of the previous N periods, the target duty cycle is 52.0%. If, with respect to this target duty cycle, the period and ON-time setting values of a PWM signal are respectively set to 10 and 5 (or 6) for example, the duty cycle of the PWM signal is equal to 50.0% (or 60.0%). Furthermore, if the period and ON-time setting values of the PWM signal are respectively set to 9 (or 11) and 5 for example, the duty cycle of the PWM signal is equal to 55.6% (or 45.5%). Accordingly, for a PWM signal having a reference period and an ON time that is almost half the period, if an ON-time setting value is changed by 1, then the duty cycle of the PWM signal will change in amounts of 10%, and if an period setting value is changed by 1, then the duty cycle of the PWM signal will change in amounts of about 5%, and thus the deviation from the target duty cycle of 52.0% is not negligible.

Therefore, in Embodiment 1, taking into consideration the fact that the periods of a PWM signal are reference periods, an ON-time setting value is determined with which an ON time that is close to a target ON time, which corresponds to the target duty cycle, can be obtained. Here, it is preferable to determine an ON-time setting value with which the ON time closest to the target ON time can be obtained. Then, a period that is determined based on the ON time obtained with this ON-time setting value and the target duty cycle is multiplied by N, and a period settable value with which a period can be obtained that is close to a result of this multiplication is divided into N setting values as evenly as possible, thus determining the period setting values for the next N periods. Also here, it is preferable to determine a period setting value with which a period can be obtained that is closest to a result of this multiplication. Specifically, assume that the reference period is 10 µs, a target ON time, which corresponds to the target duty cycle (52.0%), is 5.20 µs, and thus the ON-time setting value is determined as 5. Then, a period that is obtained by dividing an ON time (5 µs), obtained based on the ON-time setting value, by the target duty cycle (0.520) is multiplied by 4 to yield a period (38.46 µs), and a period settable value (38) with which a period closest to this period (38.46 µs) can be obtained is divided into 4 setting values, thus determining period setting values as 10, 9, 10, and 9, for example.

Accordingly, the periods of the PWM signal are 10 µs, 9 µs, 10 µs, and 9 µs in the first period, the second period, the third period, and the fourth period of the subsequent N periods. The ON time is uniformly 5 µs. That is, this means that the sum of the first period, the second period, the third period, and the fourth period is equal to 38 µs, the sum of ON time is equal to 20 µs, and an average of the duty cycles for the N periods based on the sums is equal to 52.63%. This shows that the deviation from the target duty cycle of 52.63% is within 0.63%.

The above-described period setting values may also be determined as: for example, 10, 10, 9, 9; or 9, 10, 9, 10. In other words, any combination of the setting values 10 and 9 from among the period setting values for N periods is possible, with the purpose of preventing a voltage variation, for example. By determining period setting values for N periods in this way, it is possible to determine a sum of period setting values at every N periods with respect to the generating unit 16 in units of 1, and to determine an average of period setting values for N periods in units of 1/N (here, in units of 0.25).

The following will describe an operation of the signal generating circuit 1 that determines the above-described period and ON-time setting values for N periods with reference to the flowcharts showing the operation. The processing described below is executed by the CPU 11 in accordance with a control program stored in advance in the ROM 12.

Figure 5:
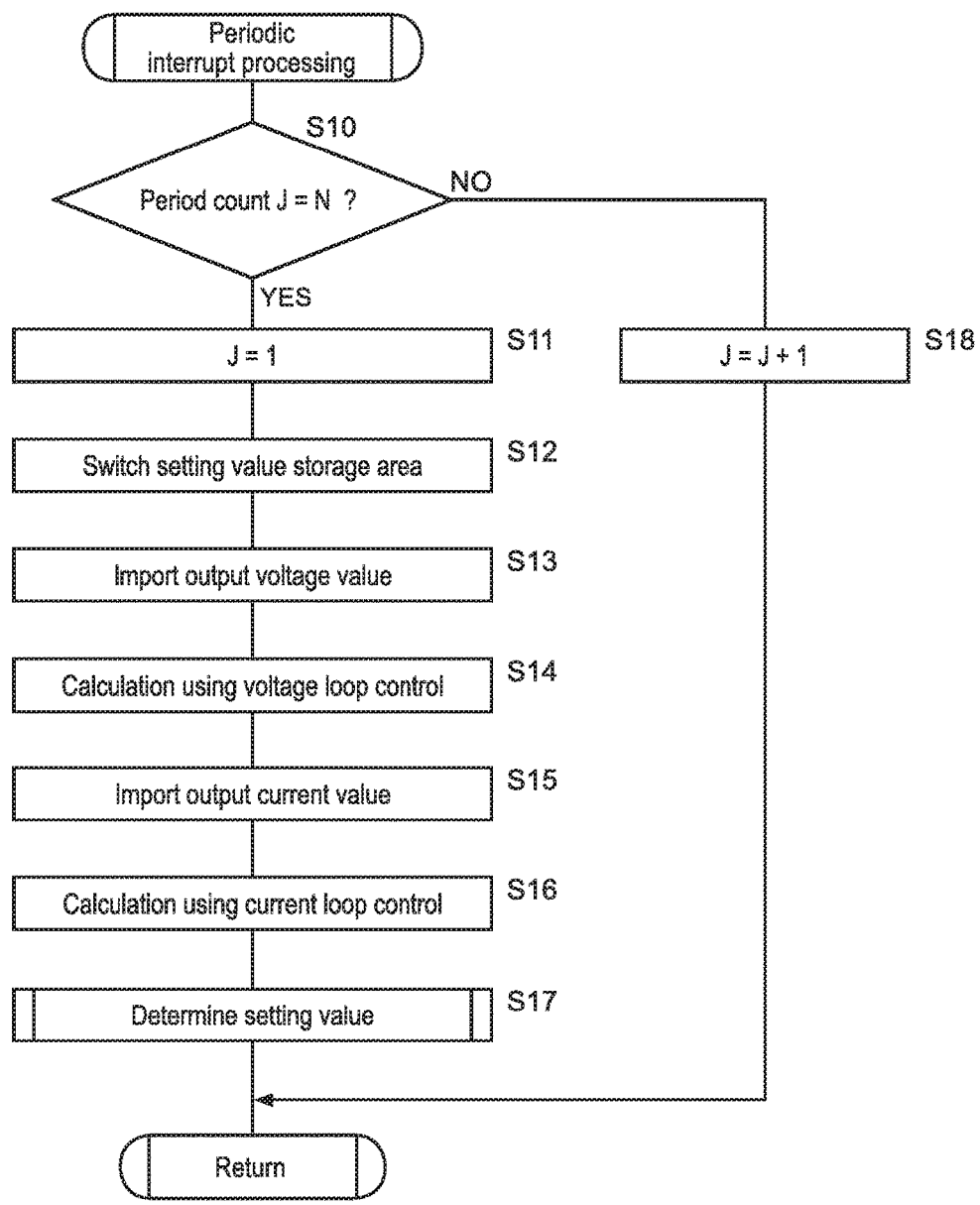
FIG. 5 is a flowchart illustrating a procedure of processing of a CPU when the signal generating circuit according to Embodiment 1 of the present invention executes periodic interrupt processing.
Figure 6:
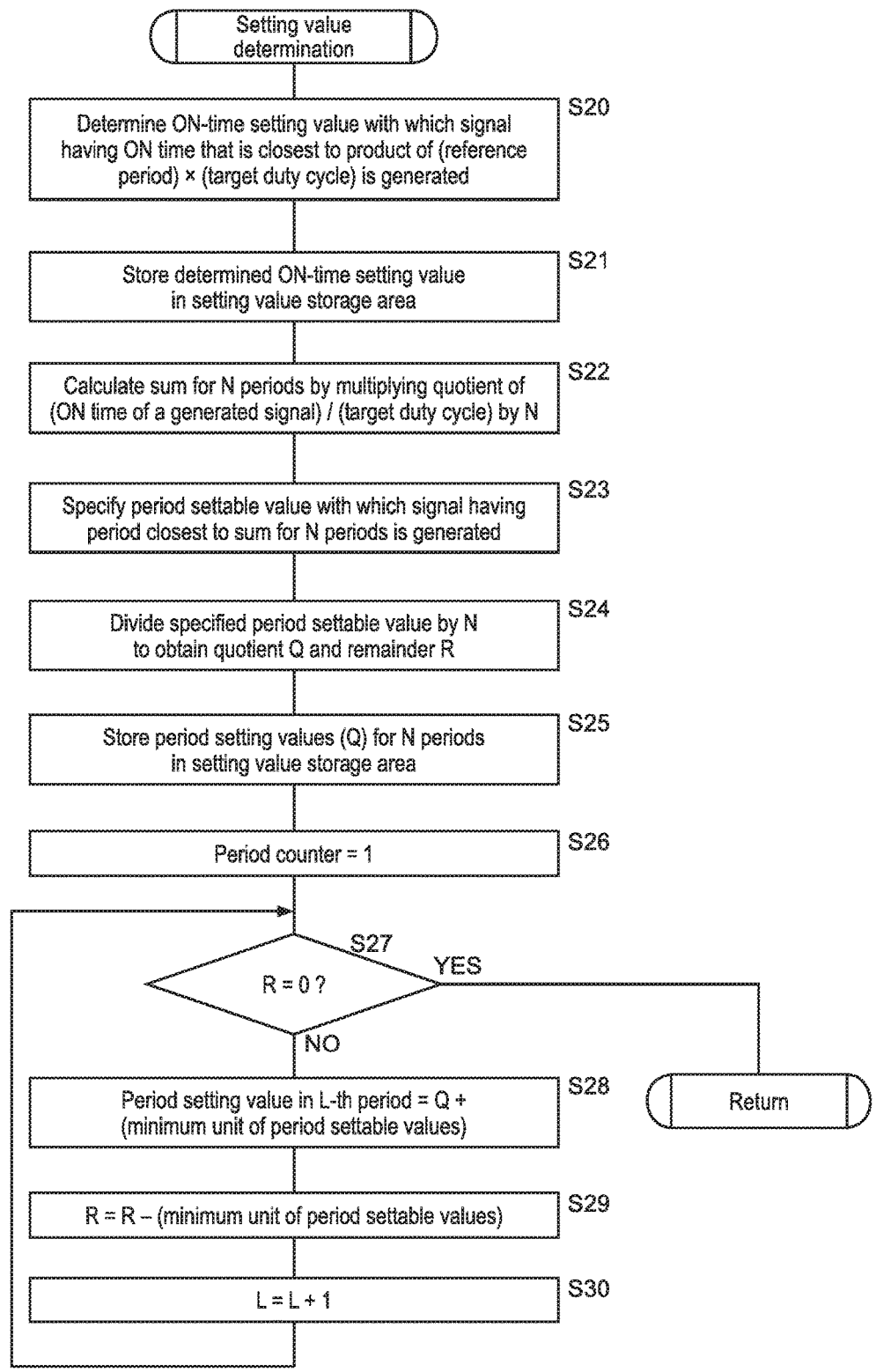
FIG. 6 is a flowchart illustrating a procedure of processing in which the CPU performs a setting value determination subroutine.

FIG. 5 is a flowchart illustrating a procedure of processing of the CPU 11 when the signal generating circuit 1 according to Embodiment 1 of the present invention executes periodic interrupt processing, and FIG. 6 is a flowchart illustrating a procedure of processing in which the CPU 11 performs a setting value determination subroutine.

A period count J in FIG. 5, information indicating which of the setting value storage areas 131a and 131b is used for storage (or reading), and a period counter L shown in FIG. 6 is stored in the RAM 13. An initial value of the period count J is N. The period and ON-time setting values for N periods that are determined in the processing of FIG. 6 are sequentially stored in successive addresses in the setting value storage area 131a or 131b. A periodic interrupt that serves as a trigger for the periodic interrupt processing shown in FIG. 5 occurs at a point in time when each of the N periods starts. For example, a configuration is possible in which a periodic interrupt occurs at rising edges of the PWM signal that is generated by the generating unit 16.

When a periodic interrupt has occurred and the control of the CPU 11 has shifted to the processing of FIG. 5, the CPU 11 determines whether or not the period count J is N (here, 4) (step S10), and if it is N (Yes in step S10), J is set to 1 (step S11), and the setting value storage areas 131*a* and 131*b* are switched between being for storage and for reading (step S12). For example, if the setting value storage area 131*b* (or 131*a*) is used for storage before the processing of step S12, then the setting value storage area 131*a* (or 131*b*) is switched to being for storage in the processing of step S12, and the setting value storage area 131*b* (or 131*a*) is switched to being for reading.

The setting value storage area 131*a* (or 131*b*) that has been switched to being for storage in step S12 serves as an area in which period and ON-time setting values for N periods that are determined by the setting value determination subroutine are to be stored. On the other hand, the setting value storage area 131*b* (or 131*a*) that has been switched to being for reading serves as an area from which the setting values are to be read by PWM interrupt processing, which will be described later.

Then, the CPU 11 imports an output voltage value into which an output voltage supplied to the load 4 is converted by the A/D converter 14 (step S13), and executes a calculation using the voltage loop control based on the imported voltage value and a target voltage value (step S14) to obtain a target current value serving as an operation amount.

Then, the CPU 11 imports an output current value into which a detection voltage from the electric current detector 27 is converted by the A/D converter 14 (step S15), and executes a calculation using the current loop control based on the imported current value and a target current value (step S16) to obtain a target duty cycle serving as an operation amount (that corresponds to a part of a "third calculation unit"). It is also possible that steps S15 and S16 are not executed so that the current loop control is omitted. If steps S15 and S16 are not executed, then a value that is calculated in step S14 serves as a target duty cycle.

Then, the CPU 11 invokes and executes the setting value determination subroutine (step S17), and then returns to the interrupted routine. On the other hand, if J is not N in step S10 (No in step S10), the CPU 11 increments J by 1 (step S18), and then returns to the interrupted routine. In other words, after every N periodic interrupts, the processing from step S11 to step S17 is executed once, and period and ON-time setting values for N periods are determined.

Moving to FIG. 6, when the setting value determination subroutine has been invoked from the periodic interrupt processing, the CPU 11 determines an ON-time setting value with which the generating unit 16 generates a PWM signal having an ON time that is closest to the ON time corresponding to a product of the reference period of the PWM signal generated by the generating unit 16 and the target duty cycle calculated in step S14 (step S20: corresponding to a "first determination unit"). In the example shown in FIG. 4, since the target duty cycle is 52.0%, a target ON time with respect to the reference period of 10 μs is calculated as 5.20 μs, and the ON-time setting value with which the generating unit 16 generates a PWM signal having the actual ON time of 5 μs, which is closest to the target ON time of 5.20 μs, is determined as "5".

Then, the CPU 11 stores the determined ON-time setting value in the setting value storage area 131*a* or 131*b* (step S21). Which of the setting value storage areas 131*a* and 131*b* is used for storage is specified in the switching processing in step S12 shown in FIG. 5.

Then, the CPU 11 divides the ON time of the PWM signal generated based on the determined ON-time setting value by the target duty cycle, and multiplies, by N, a period that corresponds to a result of this division, to calculate a sum for N periods (step S22: corresponding to a "first calculation unit"), and specifies a period settable value with which a PWM signal having a period that is closest to the calculated sum for N periods is generated (step S23: corresponding to "specifying unit"). In the example shown in FIG. 4, since the ON time of the generated signal is 5 μs, and the target duty cycle is 52.0%, the sum for N periods is calculated as (5/0.520)×4=38.46, and the closest settable value is specified as "38".

Then, the CPU 11 divides the specified settable value by N to obtain a quotient Q and a remainder R (step S24: corresponding to "second calculation unit"). In the example shown in FIG. 4, the settable value "38" is divided by 4 to yield the quotient Q of "9" and the remainder R of "2".

Then, the CPU 11 temporarily sets all of the period setting values for the N periods to the quotient "Q", and stores them in the setting value storage area 131*a* or 131*b* (step S25). Here, the "quotient Q" corresponds to a reference value for the period settable value. Which of the setting value storage areas 131*a* and 131*b* is used for storage is specified in the switching processing in step S12 shown in FIG. 5. Then, the CPU 11 resets the period counter L to 1 (step S26).

Then, the CPU 11 determines whether or not the remainder R calculated in step S24 (if step S29, which will be described later, has been executed, a remainder R as a result of the calculation of step S29) is 0 (step S27), and if the remainder R is 0 (Yes in step S27), the CPU 11 returns to the invoked routine. The remainder R being 0 means either that the processing in which the remainder R obtained as a result of the division is split into minimum units of the period settable value and the minimum units are added to at least one of the reference values is complete, or that the remainder R to be split into minimum units is 0 from the beginning.

If the remainder R is not 0 (No in step S27), the CPU 11 sets a period setting value in the L-th period to the sum of the quotient Q and the minimum unit of the period settable value (step S28), and writes it over the period setting value (Q) that is already stored in the setting value storage area 131*a* or 131*b*. In the example shown in FIG. 4, since the minimum unit of the period settable value is 1, the processing in step S28 can be replaced by processing for incrementing the period setting value stored in the setting value storage area 131*a* or 131*b* by 1.

Then, the CPU 11 sets the value obtained by subtracting the minimum unit of the period settable value from the remainder R to the new remainder R (step S29), increments the period counter L by 1 (step S30), and advances the procedure to step S27. By repeating the above-described processing from step S27 to step S30 (corresponding to a "second determination unit"), if the remainder R calculated in step S24 is not 0, the remainder R is split into minimum units of the period settable value, and the minimum units are sequentially added to one or more reference values of the period setting values.

In the flowchart of the above-described setting value determination subroutine shown in FIG. 6, N period setting values are stored in ascending order in the setting value storage area 131*a* or 131*b*, but if the value of N is fixed, it is possible to store period setting values in the most preferred storage order.

Figure 7:
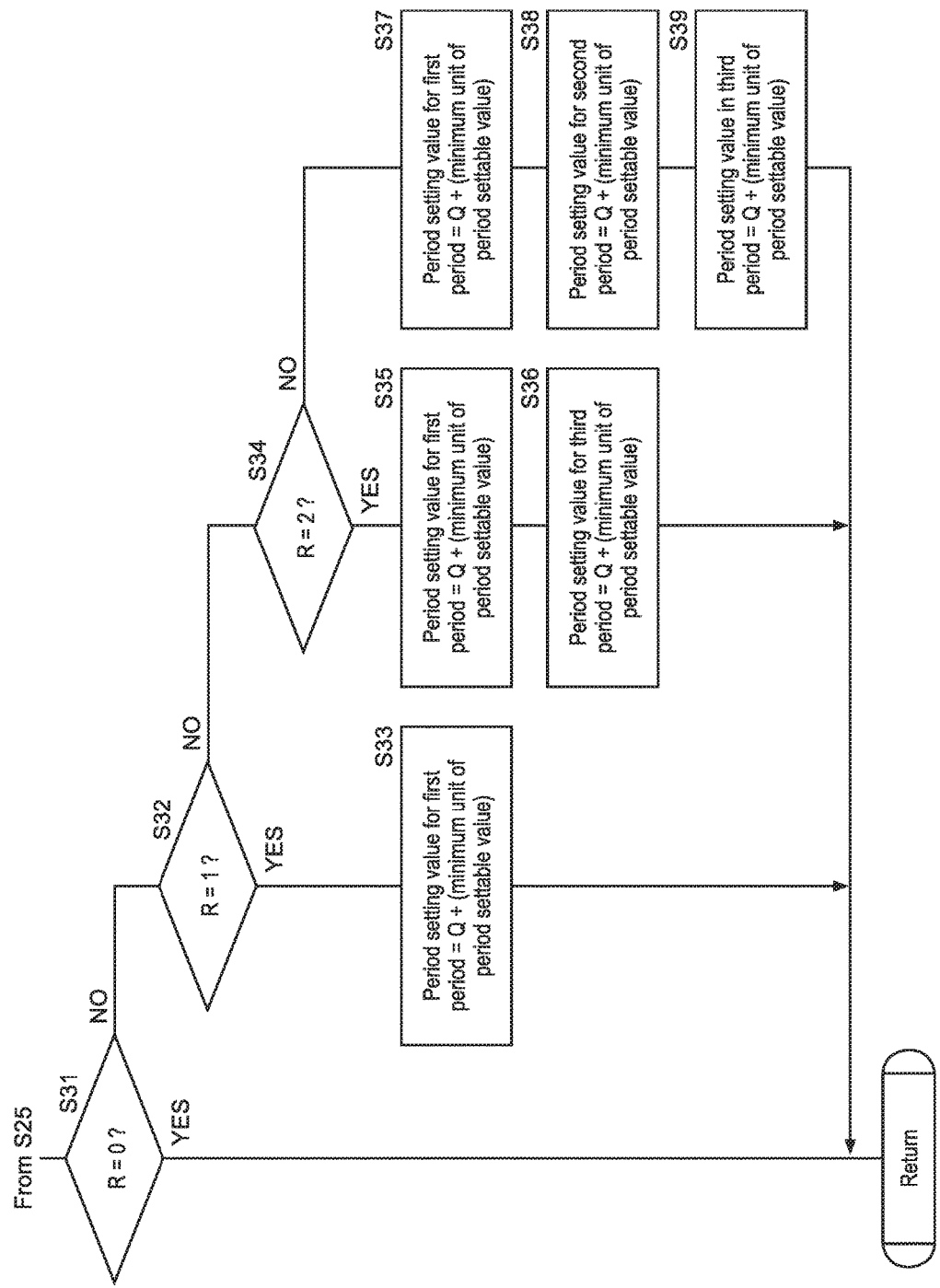
FIG. 7 is a flowchart illustrating a part of another processing procedure of the setting value determination subroutine performed by the CPU.

FIG. 7 is a flowchart illustrating a part of another processing procedure of the setting value determination subroutine performed by the CPU 11. The processing shown in FIG. 7 is executed as processing that follows the step S25 shown in FIG. 6.

After the period setting values (Q) for N periods have been stored in the setting value storage area 131a or 131b in step S25 shown in FIG. 6 (step S25), the CPU 11 determines whether or not the remainder R calculated in step S24 is 0 (step S31), and if the remainder R is 0 (Yes in step S31), the CPU 11 returns to the invoked routine.

If the remainder R is not 0 (No in step S31), the CPU 11 determined whether or not the remainder R is 1 (step S32), and if the remainder R is 1 (Yes in step S32), the CPU 11 writes the sum of the quotient Q and the minimum unit of the period settable value over the period setting value for the first period (step S33), and returns to the invoked routine. In step S33, it is also possible to write it over the period setting value for the second, third, or fourth period.

If the remainder R is not 1 (No in step S32), the CPU 11 determines whether or not the remainder R is 2 (step S34), and if the remainder R is 2 (Yes in step S34), the CPU 11 writes the sum of the quotient Q and the minimum unit of the period settable value over the period setting value for the first period (step S35), also writes the sum of the quotient Q and the minimum unit of the period settable value over the period setting value for the third period (step S36), and returns to the invoked routine. In steps S35 and S36, the writing may be performed over the period setting value for the second and fourth periods, or for the first and fourth periods, for example.

If the remainder R is not 2 (No in step S34), that is, the remainder R is 3, the CPU 11 writes the sum of the quotient Q and the minimum unit of the period settable value over the period setting value for the first period (step S37), also writes the sum of the quotient Q and the minimum unit of the period settable value over the period setting value for the second period (step S38), and also writes the sum of the quotient Q and the minimum unit of the period settable value over the period setting value for the third period (step S39), and returns to the invoked routine. In steps from S37 to S39, the period setting values that are not overwritten may be selected appropriately.

The following will describe specific examples of the period and ON-time setting values for N periods that are determined in the above-described manner.

FIG. 8 is a table illustrating a list of period and ON-time setting values for N periods that are determined based on a target duty cycle. Target duty cycles (%) are expressed as numerical values with one or two decimal places. Note that, in FIG. 8, with respect to the period setting values for N periods that are indicated in the same row, any combination of setting values may be used.

For example, if a target duty cycle is within the range from 34.79% to 34.99%, then the period setting values for N periods are determined as 9, 8, 9, 8, and the ON-time setting value is determined as 3. In this case, the average of the duty cycles over the N periods is equal to 35.29%. If a target duty cycle is within the range from 35.00% to 35.16%, then the period setting values for N periods are determined as 12, 11, 12, 11, and the ON-time setting value is determined as 4. In this case, the average of the duty cycles over the N periods is equal to 34.78%.

If a target duty cycle is within the range from 43.84% to 44.49%, then the period setting values for N periods are determined as 9, 9, 9, 9, and the ON-time setting value is determined as 4. In this case, the average of the duty cycles over the N periods is equal to 44.44%. If a target duty cycle is within the range from 45.00% to 45.97%, then the period setting values for N periods are determined as 11, 11, 11, 11, and the ON-time setting value is determined as 5. In this case, the average of the duty cycles over the N periods is equal to 45.45%. If a target duty cycle is within the range from 45.98% to 47.05%, then the period setting values for N periods are determined as 11, 11, 11, 10, and the ON-time setting value is determined as 5. In this case, the average of the duty cycles over the N periods is equal to 46.51%.

If a target duty cycle is within the range from 47.06% to 48.19%, then the period setting values for N periods are determined as 11, 10, 11, 10, and the ON-time setting value is determined as 5. In this case, the average of the duty cycles over the N periods is equal to 47.62%. If a target duty cycle is within the range from 48.20% to 49.38%, then the period setting values for N periods are determined as 11, 10, 10, 10, and the ON-time setting value is determined as 5. In this case, the average of the duty cycles over the N periods is equal to 48.78%. If a target duty cycle is within the range from 49.39% to 50.63%, then the period setting values for N periods are determined as 10, 10, 10, 10, and the ON-time setting value is determined as 5. In this case, the average of the duty cycles over the N periods is equal to 50.00%.

If a target duty cycle is within the range from 50.64% to 51.94%, then the period setting values for N periods are determined as 10, 10, 10, 9, and the ON-time setting value is determined as 5. In this case, the average of the duty cycles over the N periods is equal to 51.28%. If a target duty cycle is within the range from 51.95% to 53.33%, then the period setting values for N periods are determined as 10, 9, 10, 9, and the ON-time setting value is determined as 5. In this case, the average of the duty cycles over the N periods is equal to 52.63%. If a target duty cycle is within the range from 53.34% to 54.79%, then the period setting values for N periods are determined as 10, 9, 9, 9, and the ON-time setting value is determined as 5. In this case, the average of the duty cycles over the N periods is equal to 54.05%.

If a target duty cycle is within the range from 54.80% to 54.99%, then the period setting values for N periods are determined as 9, 9, 9, 9, and the ON-time setting value is determined as 5. In this case, the average of the duty cycles over the N periods is equal to 55.56%. If a target duty cycle is within the range from 55.00% to 55.17%, then the period setting values for N periods are determined as 11, 11, 11, 11, and the ON-time setting value is determined as 6. In this case, the average of the duty cycles over the N periods is equal to 54.55%.

The following will describe the reading of the period and ON-time setting values for N periods that are stored in the setting value storage area 131a or 131b.

Figure 9:
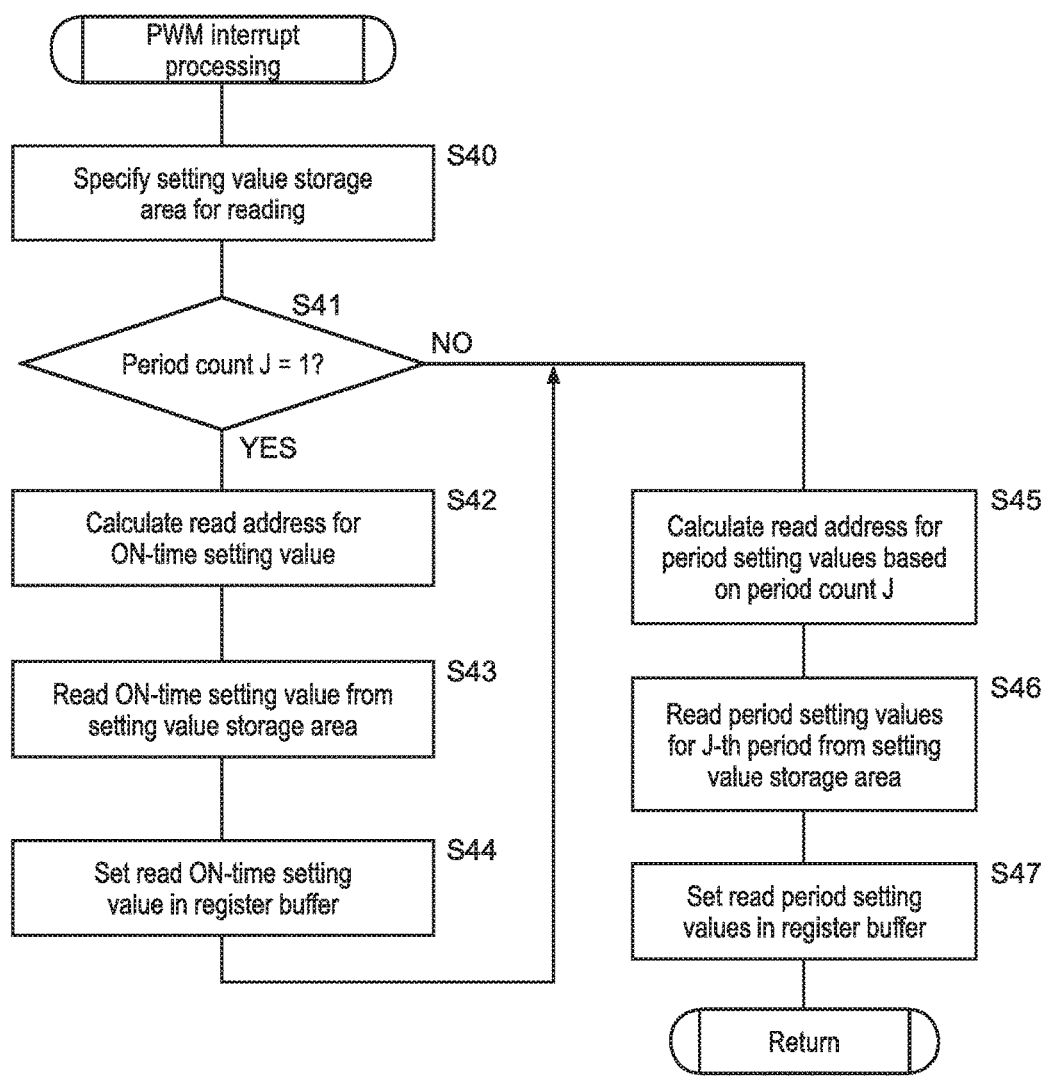
FIG. 9 is a flowchart illustrating a procedure of processing of the CPU when the signal generating circuit according to Embodiment 1 of the present invention executes PWM interrupt processing.

FIG. 9 is a flowchart illustrating a procedure of processing of the CPU 11 when the signal generating circuit 1 according to Embodiment 1 of the present invention executes PWM interrupt processing. In FIG. 9, the period count J denotes a count that is updated by the periodic interrupt processing shown in FIG. 5, and is stored in the RAM 13. The PWM interrupts that serves as triggers for the PWM interrupt processing shown in FIG. 9 occur at falling edges of the PWM signal that is generated by the generating unit 16 shown in FIG. 1.

When a PWM interrupt has occurred and the control of the CPU 11 has shifted to the processing in FIG. 9, the CPU 11 specifies which of the setting value storage area 131a or 131b is used for reading (step S40). Then, the CPU 11 determines whether or not the period count J is 1 (step S41), and if it is 1 (Yes in step S41), the CPU 11 calculates a read address for the ON-time setting value in the specified setting value storage area 131a (or 131b) (step S42). The read address here corresponds to a memory address in which the ON-time setting value is stored in step S21 of the setting value determination sub routine shown in FIG. 6.

Then, the CPU 11 reads the ON-time setting value from the specified setting value storage area 131a (or 131b) (step S43), and sets the read setting value in the register buffer 162 of the generating unit 16 (step S44). After the processing of step S44 ends, or if the period count J is not 1 (No in step S41), the CPU 11 calculates read addresses for period setting values in the specified setting value storage area 131a (or 131b) based on the period count J (step S45). The read addresses here correspond to memory addresses in which the period setting values are stored in steps S25 and S28 in the setting value determination subroutine shown in FIG. 6.

Then, the CPU 11 reads one of the period setting values for the J-th period from the specified setting value storage area 131a (or 131b) (step S46), sets the read setting value in the register buffer 161 of the generating unit 16 (step S47), and returns to the interrupted routine.

According to Embodiment 1, as described above, the CPU 11, which functions as the main part of the control unit 10, determines period and ON-time setting values that are settable in the generating unit 16 based on a target duty cycle of a PWM signal generated by the generating unit 16. Specifically, the CPU 11 determines, every N (=4) periods of the PWM signal that is generated by the generating unit 16, an ON-time setting value with which the generating unit 16 generates a PWM signal having an ON time that is closest to the ON time corresponding to a product of the reference period and the target duty cycle, and sets the determined ON-time setting value in the generating unit 16. In parallel to this, the CPU 11: divides the ON time of the PWM signal generated by the generating unit 16 based on the determined ON-time setting value by the target duty cycle; multiplies, by N, a period that corresponds to a result of this division; specifies a period settable value with which a PWM signal having a period that is closest to a result of this multiplication is generated; divides the specified settable value by N to obtain a quotient Q and a remainder R; determines period setting values for N periods based on the obtained quotient Q and remainder R; and sets the determined setting values in the generating unit 16 one by one at each period of the PWM signal.

Accordingly, since the period setting values for N periods that are determined by the CPU 11 and are to be set in the generating unit 16 are determined so that an average of the duty cycles over the N periods, of the PWM signal generated by the generating unit 16 approximates the target duty cycle, and thus an average value of the period setting values for N periods as a whole is adjusted more finely than a minimum unit of the period setting values.

Accordingly, it is possible to make a minimum unit of values that are to be set in the generating unit 16 that generates a signal having a period and an ON time that correspond to a setting value substantially smaller than an actual minimum unit.

Furthermore, according to Embodiment 1, the quotient Q obtained as a result of the above-described division is specified as a reference value for the period setting values for N periods as a whole, and the remainder R obtained as a result of the above-described division is split into minimum units (that is, minimum increments) of period settable values, and the value of the split minimum units is added to at least one of the reference values for N periods to determine period setting values for N periods.

Accordingly, the value (=1) obtained by splitting the remainder R into minimum units is appropriately allocated to at least one of the period setting values for N periods, so that at least one of the period setting values for N periods can be determined as being equal to a value obtained by adding the minimum unit value of the period settable values to the reference value, and the remaining setting values except for the at least one setting value can be determined as being equal to the reference value.

Embodiment 2

While Embodiment 1 concerns an aspect in which the determined period and ON-time setting values for N periods are temporarily stored in the setting value storage area 131a or 131b included in the RAM 13, and then sequentially read in PWM periods, Embodiment 2 concerns an aspect in which period and ON-time setting values for N periods are determined based on the content stored in advance in the setting value storage table 121 included in the ROM 12, and are sequentially read in PWM periods.

A voltage conversion device and a signal generating circuit 1 of Embodiment 2 have the same structures as those shown in FIGS. 1 and 2 of Embodiment 1. Note that in Embodiment 2, the setting value storage areas 131a and 131b included in the RAM 13 are not used. In the setting value storage table 121 included in the ROM 12, multiple sets of period and ON-time setting values for N periods that are associated with the respective target duty cycle ranges shown in FIG. 8 of Embodiment 1 are stored in advance. The setting value storage table 121 may be included in another external memory of the control unit 10. One of the multiple sets of period and ON-time setting values for N periods that are stored in the setting value storage table 121 is determined by the interrupt processing that is performed at each of N periods.

The timing chart of Embodiment 2 that shows the operation of the generating unit 16 is the same as that in FIG. 3 of Embodiment 1. Similarly, an operation in Embodiment 2 in which the signal generating circuit 1 determines typical duty cycles of a PWM signal based on the period and ON-time setting values for N periods will be apparent from the diagram shown in FIG. 4 of Embodiment 1.

In addition, the same reference numerals are given to the structures corresponding to those of Embodiment 1, and descriptions thereof are omitted.

The period and ON-time setting values for N periods that are determined based on the content stored in the setting value storage table 121 are sequentially read out by interrupt processes of a fourth period, a first period, a second period, and a third period that are successive to each other after the setting values are determined, and are set in the register buffers 161 and 162.

The following will describe an operation of the signal generating circuit 1 that determines period and ON-time setting values for N periods with reference to the flowcharts illustrating the operation.

Figure 10:
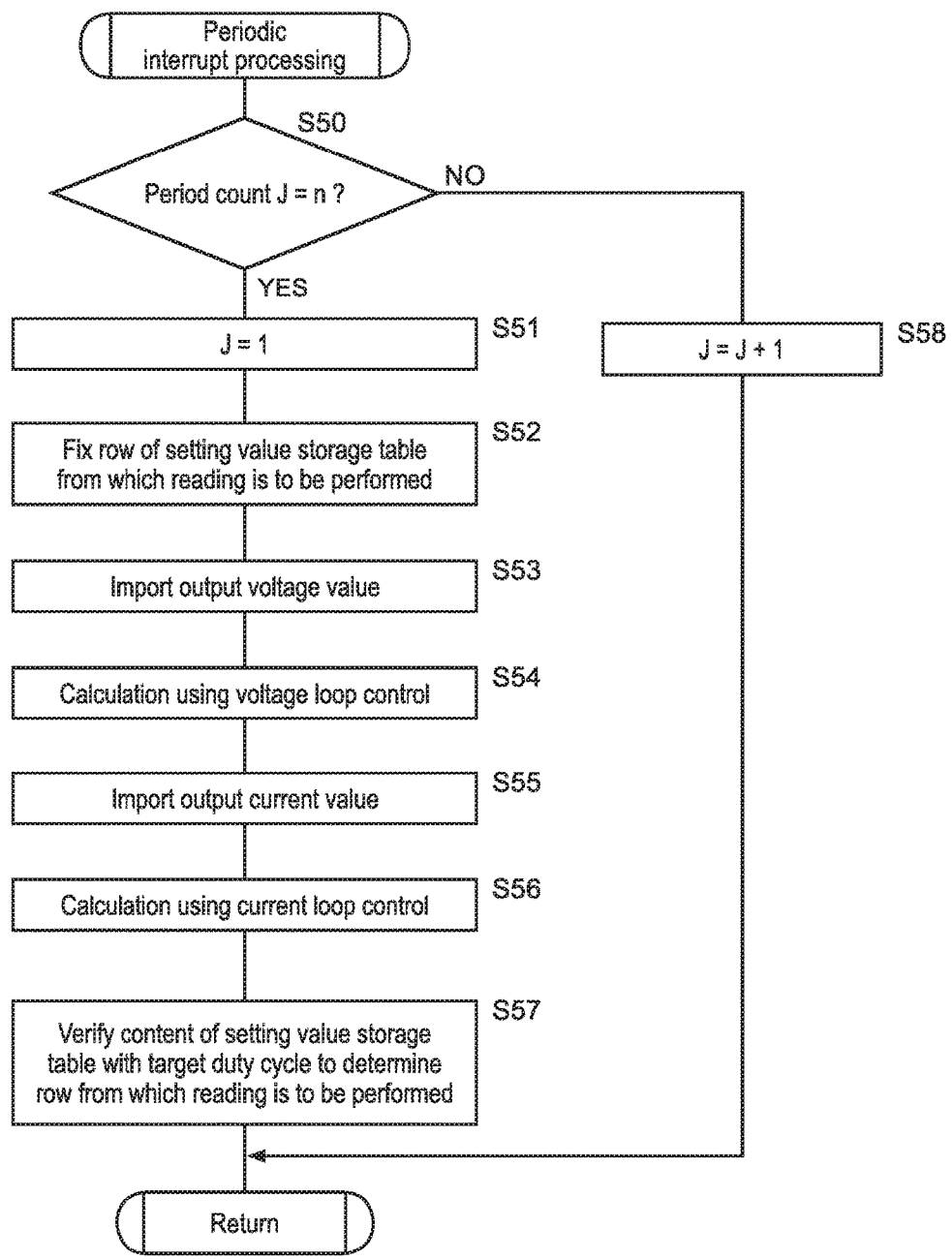
FIG. 10 is a flowchart illustrating a procedure of processing of a CPU when a signal generating circuit according to Embodiment 2 of the present invention executes periodic interrupt processing.
Figure 11:
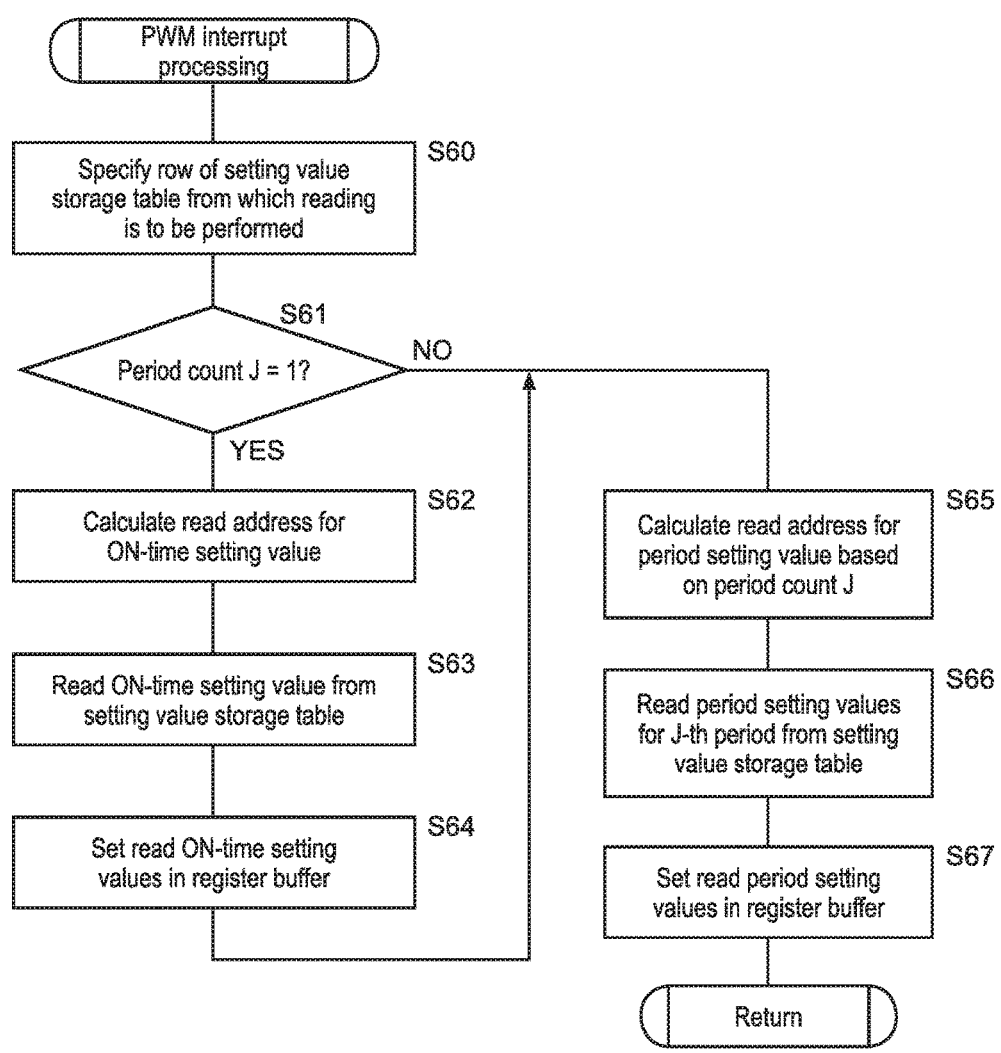
FIG. 11 is a flowchart illustrating a procedure of processing of the CPU when the signal generating circuit according to Embodiment 2 of the present invention executes PWM interrupt processing.

FIG. 10 is a flowchart illustrating a procedure of processing of the CPU 11 when the signal generating circuit 1 according to Embodiment 2 of the present invention executes periodic interrupt processing, and FIG. 11 is a flowchart illustrating a procedure of processing of the CPU 11 when the signal generating circuit 1 according to Embodiment 2 of the present invention executes PWM interrupt processing. The timings at which the interrupt processing occurs are the same as in Embodiment 1.

Note that the processes from step S50 to step S58 shown in FIG. 10 except for steps S52 and S57 are the same as the processes from step S10 to step S18 shown in FIG. 5 of Embodiment 1, and thus a part of the description will be omitted. Furthermore, the processes from step S60 to step S67 shown in FIG. 11 are similar to the processes from step S40 to step S47 shown in FIG. 9 of Embodiment 1, and thus a part of the description will be simplified.

When a periodic interrupt has occurred and the control of the CPU 11 has shifted to the processing of FIG. 10, the CPU 11 determines whether or not the period count J is N (here, 4) (step S50), and if the period count J is N (Yes in step S50), the CPU 11 sets the period count J to 1 (step S51), and fixes a row of the setting value storage table 121 from which reading is to be performed to the row (see step S57, which will be described later) that was determined in the previous periodic interrupt processing (step S52). Then, the CPU 11 executes calculation according to the voltage loop control based on an output voltage, and the current loop control based on an output current (steps S53 to S56) to obtain a target duty cycle (corresponding to a part of the "third calculation unit").

Then, the CPU 11 verifies the target duty cycle obtained by the above-described calculation with the content of the setting value storage table 121, that is, the target duty cycle ranges stored in the table, to determine a row from which reading is to be performed (step S57: corresponding to the "first and second determination units"), and then returns to the invoked routine. As a result of the verification, the period and ON-time setting values for N periods that are stored in the setting value storage table 121 in association with the range containing the target duty cycle serve as determined setting values.

Then, when a PWM interrupt has occurred and the control of the CPU 11 has shifted to the processing of FIG. 11, the CPU 11 specifies a row of the setting value storage table 121 from which reading is to be performed (step S60). Then, the CPU 11 determines whether or not the period count J is 1 (step S61), and if it is 1 (Yes in step S61), the CPU 11 calculates a read address for the specified ON-time setting value in the setting value storage table 121 (step S62), reads the ON-time setting value from the calculated address of the setting value storage table 121 (step S63), and sets the read setting value in the register buffer 161 (step S64).

After the processing in step S64 is complete, or if the period count J is not 1 (No in step S61), the CPU 11 calculates a read address for the period setting value in the specified row based on the period count J (step S65), reads the period setting value for the J-th period from the calculated address (step S66), sets the read setting value in the register buffer 162 (step S67), and returns to the interrupted routine.

According to Embodiment 2, as described above, predetermined period and ON-time setting values for N periods are stored in the setting value storage table 121 in association with target duty cycles. The CPU 11 determines, based on a target duty cycle, period and ON-time setting values for N periods that are to be set in the generating unit 16 from among information stored in the setting value storage table 121.

Therefore, it is possible to easily determine period and ON-time setting values for N periods that are to be determined in accordance with a target duty cycle at the time of execution of control by the CPU 11.

Furthermore, according to Embodiment 2, the CPU 11 sequentially reads period and ON-time setting values for N periods from the setting value storage table 121 at each of N periods of PWM control, and sets them in the generating unit 16.

Accordingly, it is possible to set the content of the setting value storage table 121 sequentially in the generating unit 16 over N periods.

Furthermore, according to Embodiment 1 or 2, the voltage conversion circuit 2 converts a voltage, using switching based on a duty cycle of a PWM signal that is generated by the above-described signal generating circuit 1, and the CPU 11 of the signal generating circuit 1 calculates the above-described target duty cycle using PWM control based on the converted voltage.

Accordingly, it is possible to apply the signal generating circuit 1 that can make a minimum unit of values that are to be set in the generating unit 16 that periodically generates PWM signals substantially smaller than an actual minimum unit, to the voltage conversion device, thus improving the accuracy in an output voltage.

The embodiments disclosed herein are exemplary in all respects, and should be construed as being not limitative. The scope of the present invention is defined by the claims rather than the meaning described above, and is intended to include all modifications within the scope and meaning equivalent to the claims. Furthermore, technical features disclosed in the embodiments can be combined with each other.

The invention claimed is:

1. A signal generating circuit comprising:
a generating unit configured to generate a PWM signal that has a period and an ON time that correspond to a setting value; and a control unit configured to set the period and ON-time settable values that are settable in the generating unit in accordance with a target duty cycle, the generating unit applying the PWM signal to an external voltage conversion circuit, and the voltage conversion circuit being subjected to PWM control to convert a voltage,
wherein the control unit includes:
a first determination unit configured to determine, at every N period (where N is a natural number equal to or greater than 2) of the PWM signal, the ON-time settable value wherein when one of the PWM signal having the ON time that approximates a product of a predetermined period and the target duty cycle is generated, the ON-time settable value is set in the generating unit;
a first calculation unit configured to divide the ON time of the signal generated based on the ON-time settable value determined by the first determination unit by the target duty cycle, and multiply, by N period, and wherein N period is a period that corresponds to a result of the division, to calculate a sum of the periods for the N periods;
a specifying unit configured to specify the period settable value with which the PWM signal having a period that approximates the sum calculated by the first calculation unit is generated;
a second calculation unit configured to divide the period settable value specified by the specifying unit by the N period to obtain a quotient and a remainder; and
a second determination unit configured to determine an N period settable values for the N periods that are set in the generating unit, based on the quotient and the remainder that were obtained by the second calculation unit.

2. The signal generating circuit according to claim 1, wherein the second determination unit is configured to determine the N period settable values for the N periods, by specifying the quotient as a reference value for the period settable values so as to generate a plurality of reference values, splitting the remainder into minimum units of the period settable values, and adding the minimum units to at least one of the plurality of reference values for N periods.

3. The signal generating circuit according to claim 2, further comprising:
a storage unit in which the period and the ON-time settable values for the N periods are stored in association with a predetermined duty cycle,
wherein the first and second determination units are configured to determine the period and ON-time settable values for N periods that correspond to the predetermined duty cycle from information stored in the storage unit.

4. A voltage conversion device comprising:
the signal generating circuit according to claim 2;
a voltage conversion circuit configured to convert the voltage using switching based on the duty cycle of the PWM signal generated by the signal generating circuit; and
a detection unit configured to detect the voltage converted by the voltage conversion circuit,
wherein the control unit provided in the signal generating circuit includes a third calculation unit configured to calculate the target duty cycle based on the voltage detected by the detection unit.

5. The signal generating circuit according to claim 1, further comprising:
a storage unit in which the period and the ON-time settable values for the N periods are stored in association with a predetermined duty cycle,
wherein the first and second determination units are configured to determine the period and ON-time settable values for N periods that correspond to the predetermined duty cycle from information stored in the storage unit.

6. The signal generating circuit according to claim 5,
wherein the control unit is configured to read, from the storage unit, the period and ON-time settable values for the N periods that were determined by the second determination unit, and set a read settable values in the generating unit.

7. A voltage conversion device comprising:
the signal generating circuit according to claim 5;
a voltage conversion circuit configured to convert the voltage using switching based on the duty cycle of the PWM signal generated by the signal generating circuit; and
a detection unit configured to detect the voltage converted by the voltage conversion circuit,
wherein the control unit provided in the signal generating circuit includes a third calculation unit configured to calculate the target duty cycle based on the voltage detected by the detection unit.

8. A voltage conversion device comprising:
the signal generating circuit according to claim 6;
a voltage conversion circuit configured to convert the voltage using switching based on the duty cycle of the PWM signal generated by the signal generating circuit; and
a detection unit configured to detect the voltage converted by the voltage conversion circuit,
wherein the control unit provided in the signal generating circuit includes a third calculation unit configured to calculate the target duty cycle based on the voltage detected by the detection unit.

9. A voltage conversion device comprising:
the signal generating circuit according to claim 1;
a voltage conversion circuit configured to convert the voltage using switching based on the duty cycle of the PWM signal generated by the signal generating circuit; and
a detection unit configured to detect the voltage converted by the voltage conversion circuit,
wherein the control unit provided in the signal generating circuit includes a third calculation unit configured to calculate the target duty cycle based on the voltage detected by the detection unit.

10. A signal generating method in which a signal generating circuit generates a PWM signal, the signal generating circuit including a generating unit configured to generate the PWM signal having a period and ON time that correspond to a setting value, and a control unit configured to set period and ON-time settable values that are settable in the generating unit in accordance with a target duty cycle, the generating unit applying the PWM signal to an external voltage conversion circuit, the voltage conversion circuit being subjected to PWM control to convert a voltage, and the method comprising:
determining, at every N periods (where N is a natural number equal to or greater than 2) of the PWM signal, an ON-time settable value with which the PWM signal having an ON time that approximates a product of a predetermined period and the target duty cycle is generated, the ON-time settable value being set in the generating unit;
dividing the ON time of the signal generated based on the ON-time settable value determined by the first determination unit by the target duty cycle, and multiplying, by N period, wherein N period is a period that corresponds to a result of the division, to calculate a sum of the periods for N periods;
specifying a period settable value with which a signal having a period that approximates the calculated sum is generated;
dividing the specified period settable value by N period to obtain a quotient and a remainder; and determining the N period settable values for the N periods that are set in the generating unit, based on the calculated quotient and remainder.

* * * * *